US009588240B1

(12) United States Patent
Kouada et al.

(10) Patent No.: US 9,588,240 B1
(45) Date of Patent: Mar. 7, 2017

(54) DIGITAL READOUT ARCHITECTURE FOR FOUR SIDE BUTTABLE DIGITAL X-RAY DETECTOR

(71) Applicant: General Electric Company, Schenectady, NY (US)

(72) Inventors: Ibrahim Issoufou Kouada, Niskayuna, NY (US); Brian David Yanoff, Niskayuna, NY (US); Jonathan David Short, Niskayuna, NY (US); Jianjun Guo, Niskayuna, NY (US); Biju Jacob, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 14/923,812

(22) Filed: Oct. 27, 2015

(51) Int. Cl.
*G01T 1/24* (2006.01)
(52) U.S. Cl.
CPC .................................. *G01T 1/247* (2013.01)
(58) Field of Classification Search
CPC ...... H01L 27/14643; G01T 1/24; G01T 1/247
See application file for complete search history.

(56) References Cited

U.S. PATENT DOCUMENTS

| | | | |
|---|---|---|---|
| 5,005,195 A | 4/1991 | Lanza et al. | |
| 6,380,880 B1 | 4/2002 | Bidermann | |
| 7,443,435 B2 * | 10/2008 | Loose | H04N 5/243 330/278 |
| 7,746,400 B2 * | 6/2010 | Mo | H04N 5/361 250/208.1 |
| 8,754,972 B2 | 6/2014 | Brown et al. | |
| 9,117,721 B1 | 8/2015 | Godfrey et al. | |

(Continued)

FOREIGN PATENT DOCUMENTS

| | | |
|---|---|---|
| WO | 2012/138345 A1 | 10/2012 |
| WO | 2014072939 A1 | 5/2014 |

OTHER PUBLICATIONS

"PixFEL Enabling technologies, building blocks and architectures for advanced X-ray Pixel cameras at FELs", 2014, (pp. 1-26, 26 total pages).

(Continued)

*Primary Examiner* — Marcus Taningco
(74) *Attorney, Agent, or Firm* — Melissa K. Dobson

(57) ABSTRACT

An imager tile including four-side buttable sub-imager pixel arrays with on-chip digitizing electronic readout circuit. Pixel groupings formed from among the plurality of imagers. Readout electronics including a buffer amplifier for each of the pixel groupings are connected to respective outputs of buttable imagers. Shared analog front ends connect to respective buffer amplifiers of pixel groupings. An analog-to-digital converter at a common centroid location relative to the shared analog front ends includes three data lines—selection input/output line to individually select an output, a clock input line, and a shared digital output line. A pixel output from a respective buffer amplifier is addressable by data provided on the selection input/output line, and the pixel output is provided on the shared digital output line. The I/O lines connected to a programmable logic device where the imager serial data input is output as a massively parallel data stream.

20 Claims, 4 Drawing Sheets

(56) References Cited

U.S. PATENT DOCUMENTS

| | | | |
|---|---|---|---|
| 2006/0050162 A1* | 3/2006 | Nakamura | H04N 5/335 348/308 |
| 2006/0192087 A1 | 8/2006 | Kuszpet et al. | |
| 2012/0188422 A1 | 7/2012 | Cho | |

OTHER PUBLICATIONS

Deptuch, Grzegorz W. et al., "Design and Tests of the Vertically Integrated Photon Imaging Chip", IEEE Transactions on Nuclear Science, vol. 61, No. 1, Feb. 2014, (pp. 663-674, 12 total pages).

Tamaki, Mitsuru et al., "Development of 4-Sides Buttable CdTe-ASIC Hybrid Module for X-ray Flat Panel Detector", IEEE Transactions on Nuclear Science, vol. 56, No. 4, Aug. 2009, DOI: 10.1109/TNS.2009.2024417, (pp. 1791-179, 4 total pages).

Batignani, G. et al., 3D integration of advanced pixel detectors and readout electronics, Valerio Re—WE Heraeus Seminar—Bad Honnef, May 23, 2013, (pp. 1-48, 48 total pages).

Ratti, Lodovico "The PixFEL project: developing a fine pitch, fast 2D X-ray imager for the next generation X-FELS", 10th International Conference on Radiation Effects on Semiconductor Materials, Detectors and Devices (RESMDD14), Florence, Italy, Oct. 2014, (pp. 1-41, 41 total pages).

Rowlands, J. A. et al., "Low cost digital radiographic imaging systems: The x-ray light valve", Medical Imaging 2006: Physics of Medical Imaging, Proceedings of SPIE, vol. 6142, 614203, 2006, DOI: 10.117/12.650195, 9pgs.

PCT Search Report and Written Opinion issued in connection with corresponding PCT Application No. US2016/053029 on Dec. 2, 2016.

\* cited by examiner

DIGITAL READOUT ARCHITECTURE FOR FOUR SIDE BUTTABLE DIGITAL X-RAY DETECTOR

BACKGROUND

CMOS image sensors can be integrated with all kinds of functional circuitry and blocks in a single chip. A digital imager typically can include a photodiode array, column readout structure, A/D conversion, and digital controllers (or processors) on single or multiple substrates. Conventional back-side illuminated (BSI) imager can divide the photodiode and circuitry into different strata, providing photons to the photodiodes directly from the other side of the substrate. FIG. 1 depicts conventional four-side buttable BSI imager 100 using multiple layers of chips stacked in a three-dimensional (3D) package. On a first layer, the 3D BSI imager includes imaging sensor array 110 with pixels containing photodiodes that are exposed to incident light. Traces 120 route the pixel output(s) to layers of silicon stack 130. The silicon stack can include top and bottom aluminum nitride substrates 132, 133. Between the AlN caps can be rerouting interposer 134 along with analog-digital converter (ADC) master control chip 136 and ADC slave control chip 137. System interface 140 can be connected to BSI imager 100 via spring-loaded (POGO) pins 145.

In some implementations, a buttable sub-imager can be a building block for an X-ray detector used in, for instance, medical diagnostic equipment. An X-ray detector based on a buttable sub-imager can typically require up to hundreds of sub-imagers to obtain an image from a region of interest. This quantity of sub-imagers can have a large amount of digital input/output (I/O) control lines with a massive amount of digital data being obtained in parallel to achieve fast frame rate (e.g., 100 frames/second). The address and control of sub-imagers and their readout data is needed for better image processing.

DESCRIPTION

In accordance with embodiments, a four-side buttable complementary metal oxide semiconductor (CMOS) imager includes readout electronics distributed on-wafer among the array of photodiode pixels and incorporates a programmable logic device (e.g., a complex programmable logic device (CPLD), field programmable gate array (FPGA), Programmable Array Logic (PAL), a microcontroller, application-specific integrated circuit (ASIC), etc.) that is fully scalable and addressable, can be used across all the modalities. Embodying devices provide a control and readout architecture for the four-side buttable CMOS x-ray detector.

In accordance with implementations, a CPLD provides a lower cost option with a large number of logic gates to achieve a required level of data processing for the control and readout architecture. Additionally, a CPLD includes non-volatile configuration memory, which eliminates the need for external ROM as required with some other programmable logic devices.

Figure 1:
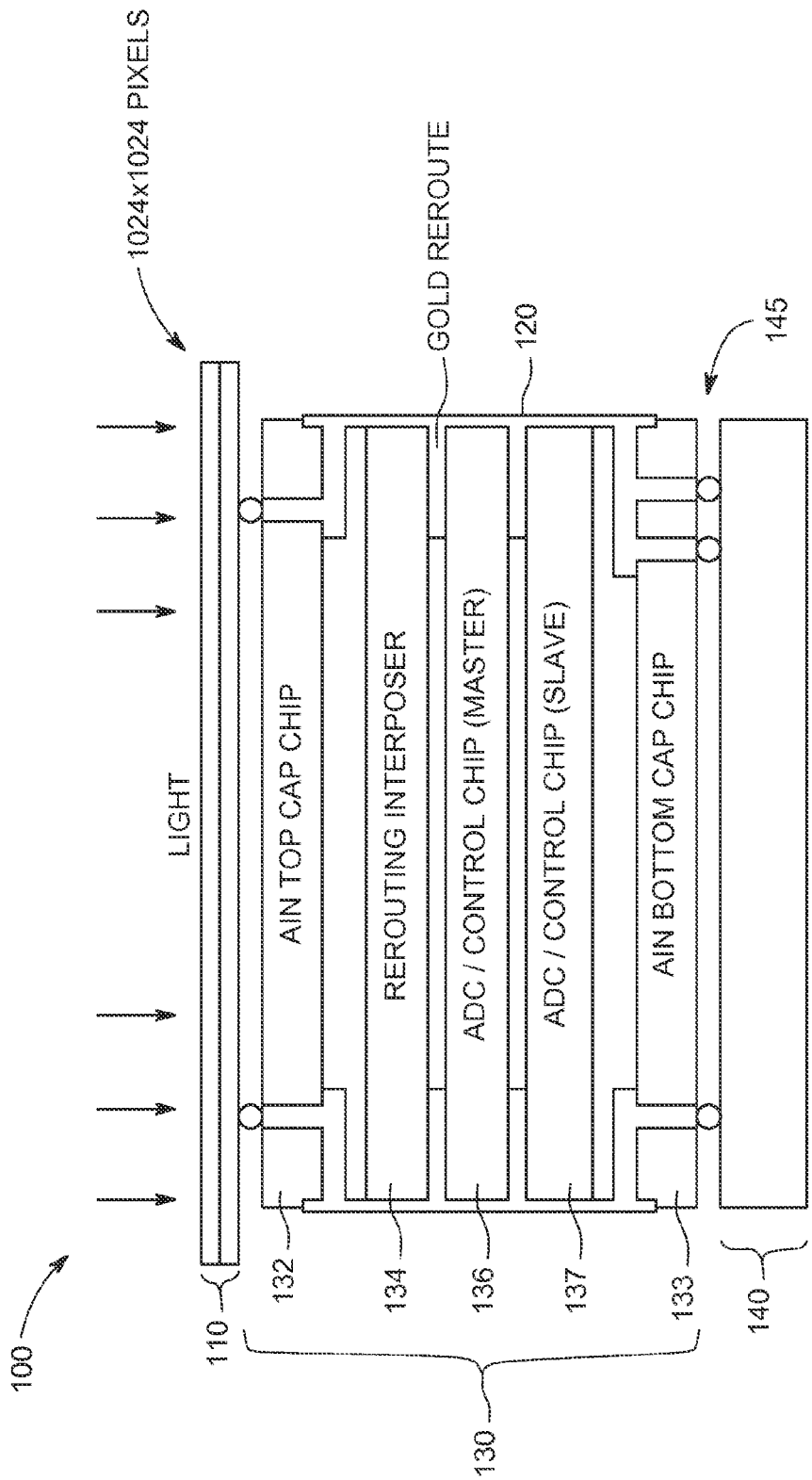
FIG. 1 depicts a conventional BSI 4-side buttable imager.
Figure 2:
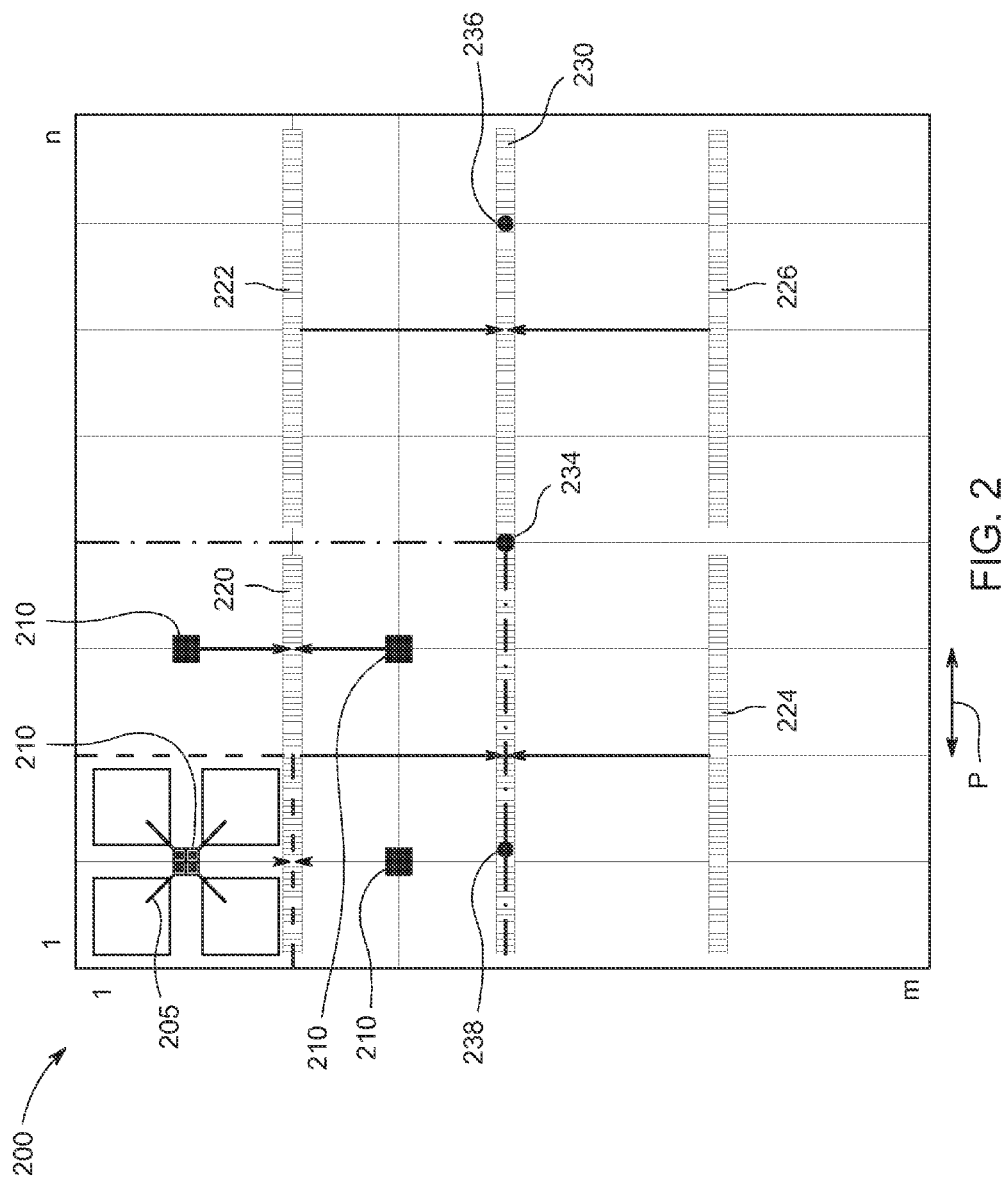
FIG. 2 depicts a sub-imager pixel array in accordance with embodiments.

FIG. 2 depicts sub-imager pixel array 200 formed from combining multiple imager pixels P in accordance with embodiments. For example, the depicted array is a m×n array of imager pixels where m=n=8 in this instance for purposes of discussion. However, embodiments are not so limited and m and n can be other predetermined numbers that can be independent of each other.

In accordance with embodiments, the outputs of multiple pixels can be grouped together. By way of example, sub-imager pixel array 200 is depicted as having groupings of four pixels. Each of the pixel groupings shares its own respective buffer amplifier 210. Each pixel output of the group is connected to its respective amplifier by respective trace 205, which is positioned symmetrically with respect to each of the group's pixels.

The amplifier is located in the pixel grouping at a common centroid layout to improve uniformity in the length and positioning of trace 205. The amplifier can include multiplexed addressable inputs so that the output of each pixel is individually selectable.

Multiple amplifiers are grouped together by connection to shared analog front end 220, 222, 224, 226. Each shared analog front end 220, 222, 224, 226 is at a common centroid location relative to its connected respective amplifiers to equalize trace path lengths and bends between each respective amplifier to its connected analog front end.

In accordance with embodiments, each sub-imager pixel array can include ADC 230 located at common centroid location relative to the shared analog front ends. In accordance with embodiments, the sub-imager can have more than one ADC. The ADC provides digital output for the sub-imager. In accordance with embodiments, the ADC digital output of a BSI imager is connected to a trace on the sub-imager backside by three through-substrate-via (TSV) 234, 236, 238.

In accordance with embodiments, shared digital output TSV 234 provides the digital data output. Sub-imager select I/O TSV 236 provides the address selection to the individual addressable buffer amplifier. The ADC has fully addressable inputs so that each of its input signals provided by respective shared analog front end 220, 222, 224, 226 are individually selectable based on the sub-imager select I/O signal. The ADC Sub-imager clock I/O TSV 238 provides a clock signal to address and/or read the individual addressable shared amplifiers 210. Embodying devices are not so limited, accordingly, a FSI imager can also have shared digital output 234, sub-imager select I/O 236, and sub-imager clock I/O 238. As should be readily understood the FSI imager would not need any TSVs to implement these features.

In accordance with embodiments, the readout electronics disclosed above (i.e., buffer amplifier 210, analog front end 220, 222, 224, 226, and ADC 230) are distributed on-wafer among the pixels of pixel array 200.

In accordance with embodiments, sub-imager pixel array can accommodate binning at the lowest level. As noted above, the input to shared amplifier 210 is addressable. Further, binning at a 2×2 level of pixels can be achieved by selectively addressing the inputs to each of the shared analog front end 220, 222, 224, 226. By selectively addressing the inputs to ADC 230, 4×4 binning can be achieved. Binning of an embodying sub-imager pixel array can be performed in both row and column directions because of the fully addressable configuration of the electronics. In particular, because binning of embodying sub-imager pixel array can be performed at the analog level, the noise penalty of binning at the digital level is eliminated.

Because the level of binning can be selectively achieved from the lowest to highest resolutions, the ROI is fully addressable. Scan time can be decreased by minimizing data acquisition outside the ROI region. For example, every tenth data frame could be fully read from each imager, otherwise binning can be performed outside the ROI during the other frames. Such implementation of binning made possible by embodying imagers results in the ROI having the highest resolution image, while areas outside the ROI have a lower resolution image.

Figure 3:
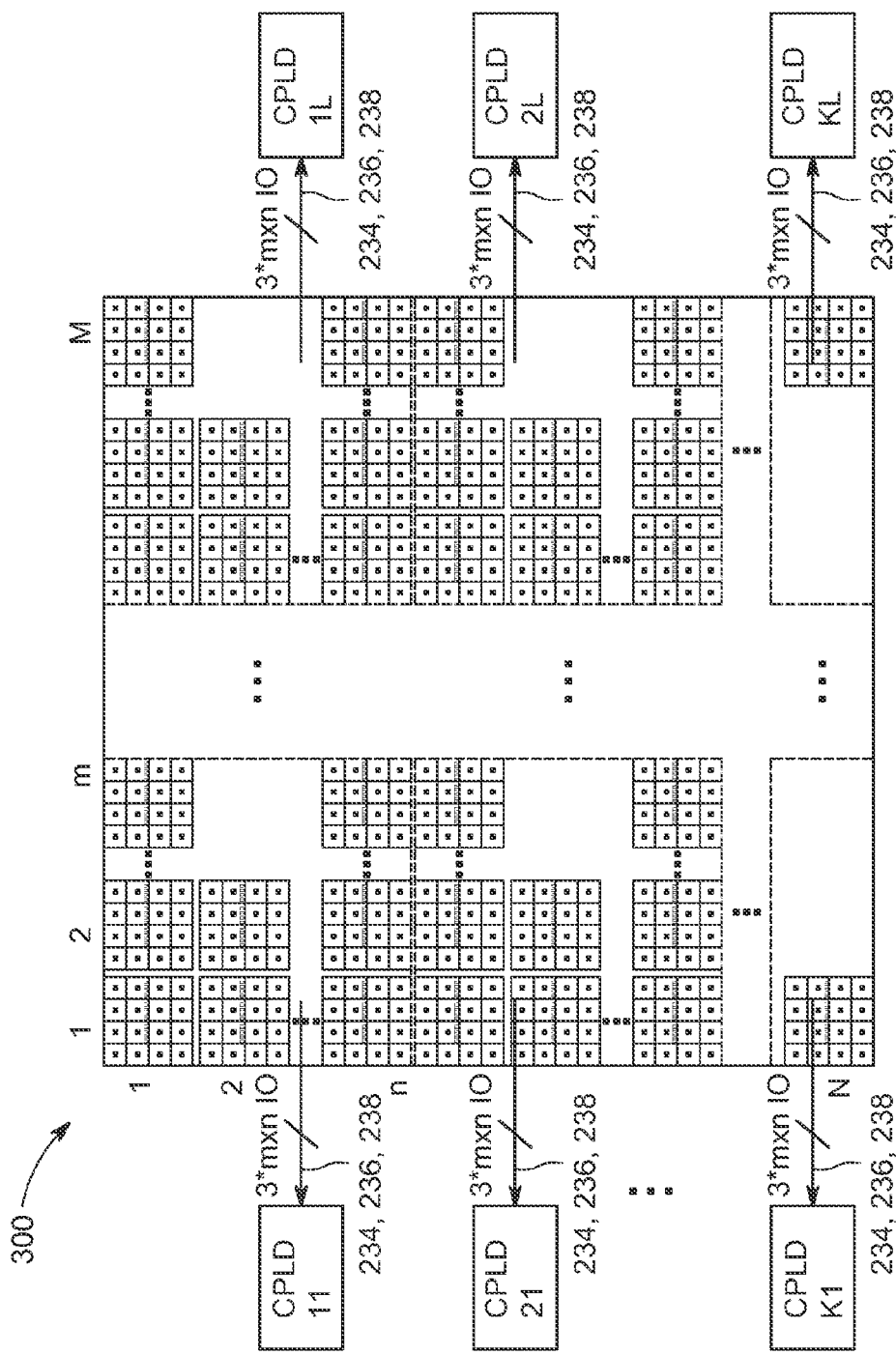
FIG. 3 depicts an imager tile in accordance with embodiments.

FIG. 3 depicts imager tile 300 formed from an M×N array of sub-imager pixel arrays 200 in accordance with embodiments. As disclosed above, each sub-imager pixel array is an m×n array of pixels having sub-imager readout electronics on-wafer among the array of photodiode pixels. The configuration depicted has M=mL and N=nK array of sub-imagers. The control/readout lines of each sub-imager (i.e., shared digital output 234, sub-imager select I/O 236, and sub-imager clock I/O 238) are connected to respective programmable logic devices. For example, the depicted embodiment has a respective complex programmable logic device CPLD 11, CPLD 21, . . . , CPLD K1, . . . CPLD 1L, CPLD 2L, . . . , CPLD KL connected to respective data input/output (I/O) lines (i.e., a set of multiple digital lines that together communicate data, control, and/or acknowledgement signals between one device and another, where in one implementation the data lines can operate in a bus configuration (e.g., shared data lines)) from each sub-imager.

Based on current CMOS wafer fabrication technology, for a pixel size of 50 micron×50 micron, and a sub-imager array where m=n=8, the largest embodying imager tile 300 that can be produced without stitching is M×N=60×80 (i.e., 2.4 cm×3.2 cm). However, embodying imagers are not so limited and other sizes can be produced should wafer fabrication technology permit. The values for the number of rows and columns M×N can be selected based on the application size of the imager tile, where the predetermined numbers for M and N can be independent of each other. Multiple imager tiles 300 can be butted together to form the imager based on its use. The size of the imager formed from multiple imager tiles 400 is dependent on the application of the imager.

Figure 4:
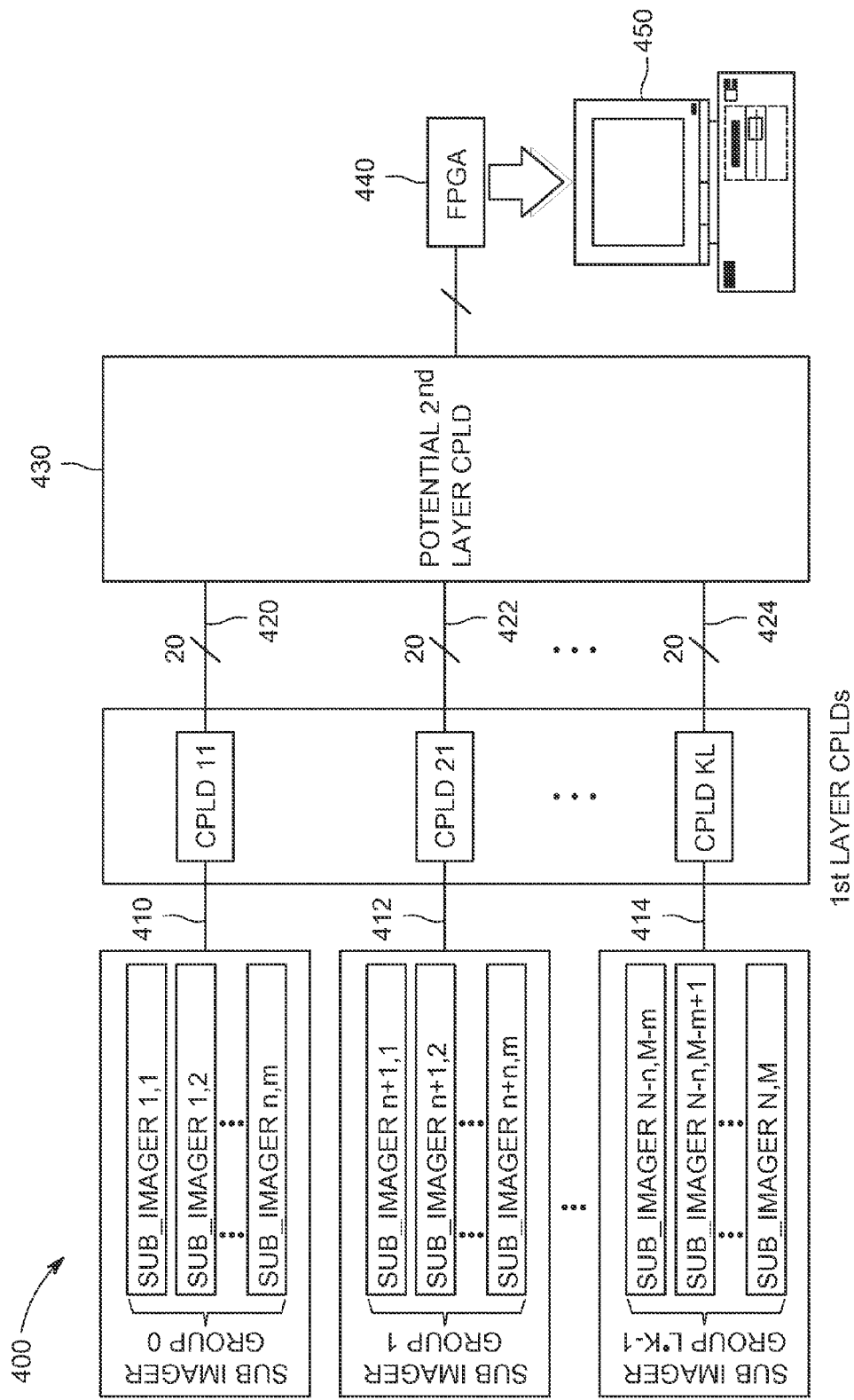
FIG. 4 depicts a general architecture of the imager tile of FIG. 3 in accordance with embodiments.

FIG. 4 depicts general architecture 400 of imager tile 300 in accordance with embodiments. The general architecture of the imager includes sub-imager groups Group 1, Group 2, . . . , Group L*K−1. Each sub-imager group includes multiple sub-imagers pixel arrays 200. The control and/or readout of each respective sub-imager groups are connected to respective programmable logic devices (e.g., CPLD 11, CPLD 21, . . . , CPLD K1) by respective serial data I/O lines 410, 412, . . . , 414. In accordance with implementations, the data I/O lines can be 16 bit lines. General architecture 400 is scalable to accommodate any number of tiles that can be combined to form a detector. In some embodiments, more than one respective programmable logic device can be connected by additional respective serial data I/O lines to respective sub-imager groups. By adding more programmable logic devices in parallel, the through-put of the imager is maintained by changing the serial imager data to a massively parallel data stream.

The output of each respective programmable logic device is to a respective parallel data bus 420, 422, . . . , 424. The parallel data bus can connect the output of the programmable logic device to digital controller 440, which can be a FPGA. Digital controller 440 executes computer instructions to provide pixel selection to the sub-imager groups, clock signals, and read the data readout lines. Digital controller 440 provides control signals to respective amplifiers, respective front end amplifiers and ADCs of the sub-imager groups. In accordance with embodiments, digital controller 440 can include a binning/multiplex control stage and an amplifier gain/power control stage.

Digital controller 440 can provide the image data to central processor controlled workstation 450 for reconstruction and processing. In some embodiments, where there is a large number of tiles in the detector, second layer of programmable logic devices 430 can be provided to further increase the speed of the system throughput. The width of data I/O lines connecting the second layer of programmable logic devices output to an input of digital controller 440 could be wider than the individual parallel data buses 420, 422, . . . , 424, but has a lower data I/O line count compared to the aggregate parallel bus formed by parallel data buses 420, 422, . . . , 424. The quantity of input lines connecting the second layer of programmable logic devices input to the first layer of programmable logic devices output is smaller than the quantity of data input/output lines 410, 412, . . . , 414 connecting the first layer of programmable logic devices input to the respective analog-to-digital converters of the sub-imager groups.

In accordance with implementations, the signal of sub-imager i can follow a redundant output path by control of a switch located in an adjacent sub-imager pixel array. The timing to read the output of sub-imager i at the output of sub-imager i−1 can be controlled by digital controller 440. In another implementation where digital output 334 cannot be read, a redundant analog-to-digital converter can be accessed under control of digital controller 440 when another switch is closed. In this implementation, a fabrication error that corrupted the sub-imager's ADC can be overcome by accessing the redundant ADC.

Although specific hardware and methods have been described herein, note that any number of other configurations may be provided in accordance with embodiments of the invention. Thus, while there have been shown, described, and pointed out fundamental novel features of the invention, it will be understood that various omissions, substitutions, and changes in the form and details of the illustrated embodiments, and in their operation, may be made by those skilled in the art without departing from the spirit and scope of the invention. Substitutions of elements from one embodiment to another are also fully intended and contemplated. The invention is defined solely with regard to the claims appended hereto, and equivalents of the recitations therein.

The invention claimed is:

1. An imager tile comprising:
an array of sub-imager pixel arrays, the sub-imager pixel arrays arranged in rows and columns;
each of the sub-imager pixel arrays including a plurality of four-side buttable imagers distributed on a wafer substrate and an on-chip digitizing electronic readout circuit;
each of the four-side buttable imagers including at least one photodiode configured to be exposed to incident photon radiation;
a plurality of pixel groupings formed from among the plurality of imagers;

the readout electronics including a buffer amplifier for each of the plurality of pixel groupings and connected to respective outputs of each four-side buttable imager of the pixel grouping;

a plurality of shared analog front ends, each shared analog front end connected to respective multiple buffer amplifiers from among the plurality of pixel groupings;

an analog-to-digital converter located at a common centroid location relative to the plurality of shared analog front ends, the analog-to-digital converter having a selection input/output line to individually select an output from each of the plurality of shared analog front ends;

the analog-to-digital converter having a clock input line, and a shared digital output line that is shared among the respective multiple buffer amplifiers;

wherein a pixel output from a respective buffer amplifier is addressable by data provided on the selection input/output line, and the pixel output is provided on the shared digital output line.

2. The imager tile of claim 1, including a programmable logic device in communication with a respective analog-to-digital converter across a respective data input/output lines, the respective data input/output lines including the selection input/output line, the clock input line, and the shared digital output line of the respective analog-to-digital converter.

3. The imager tile of claim 2, the programmable logic device selected from the group including a complex programmable logic device, a field programmable gate array, a programmable array logic device, a microcontroller, and an application-specific integrated circuit.

4. The imager tile of claim 2, including a first layer of programmable logic devices in communication with a group of respective analog-to-digital converters across the respective data input/output lines, the respective data input/output lines including a selection signal line configured to address an individual analog-to-digital converter from among the group of respective analog-to-digital converters.

5. The imager tile of claim 4, including:

a parallel data bus, and a digital controller connected to the first layer of programmable logic devices, the digital controller configured to execute instructions that cause the digital controller to provide pixel selection control signals; and a central controller connected to an output of the second layer of programmable logic devices, the workstation configured to process and reconstruct an image from readout data of the sub-imagers.

6. The imager tile of claim 4, including a second layer of programmable logic devices in communication with the first layer of programmable logic devices, the second layer of programmable logic devices having a quantity of data input/output lines connecting the second layer of programmable logic devices to the first layer of programmable logic devices that is smaller than a quantity of the respective data input/output lines connecting the first layer of programmable logic devices to the group of respective analog-to-digital converters.

7. The imager tile of claim 6, including:

a parallel data bus, and a digital controller connected to the second layer of programmable logic devices, the digital controller configured to execute instruction that cause the digital controller to provide pixel selection control signals; and a central controller connected to an output of the second layer of programmable logic devices, the workstation configured to process and reconstruct an image from readout data of the sub-imagers.

8. The imager tile of claim 1, the buffer amplifier located at a centroid common to each four-side buttable imager pixel of the pixel grouping.

9. The imager tile of claim 8, including a respective circuit trace symmetrically located from each four-side buttable imager pixel of the pixel grouping to an input of the buffer amplifier.

10. The imager tile of claim 1, including:

a redundant output path connecting a first one of the sub-imager pixel arrays to an adjacent one of the sub-imager pixel arrays; and a control switch configured to close the redundant output path under control of a digital controller.

11. A semiconductor imager comprising:

a plurality of four-side buttable imager pixels each including a photodiode configured to be exposed to incident photon radiation;

a plurality of pixel groupings formed from among the plurality of four-side buttable imager pixels, each of the pixel groupings including a buffer amplifier connected to respective outputs of each four-side buttable imager pixel of the pixel grouping;

each buffer amplifier located at a common centroid location relative to respective four-side buttable imager pixels of respective pixel groupings;

an array of sub-imager pixel arrays formed from among the plurality of pixel groupings, the sub-imager pixels arrays arranged in rows and columns;

a plurality of shared analog front ends, each shared analog front end connected to respective multiple buffer amplifiers from among the plurality of pixel groupings;

each shared analog front end located at a common centroid location relative to respective pixel groupings of respective sub-imager pixel arrays;

an analog-to-digital converter located at a common centroid location relative to the plurality of shared analog front ends, the analog-to-digital converter having a selection input/output line to individually select an output from each of the plurality of shared analog front ends;

the analog-to-digital converter having a clock input line, and a shared digital output line that is shared among the respective multiple buffer amplifiers;

wherein a pixel output from a respective buffer amplifier is addressable by data provided on the selection input/output line, and the pixel output is provided on the shared digital output line.

12. The semiconductor imager of claim 11, including a programmable logic device in communication with a respective analog-to-digital converter across a respective data input/output lines, the respective data input/output lines including the selection input/output line, the clock input line, and the shared digital output line of the respective analog-to-digital converter, the programmable logic device converting imager serial data to a massively parallel data stream.

13. The semiconductor imager of claim 12, the programmable logic device selected from the group including a complex programmable logic device, a field programmable gate array, a programmable array logic device, a microcontroller, and an application-specific integrated circuit.

14. The semiconductor imager of claim 12, including a first layer of programmable logic devices in communication with a group of respective analog-to-digital converters across the respective data input/output line, the respective data input/output line including a selection signal line configured to address an individual analog-to-digital converter from among the group of respective analog-to-digital converters.

15. The semiconductor imager of claim 14, including
a parallel data bus, and a digital controller connected to the first layer of programmable logic devices, the digital controller configured to execute instruction that cause the digital controller to provide pixel selection control signals; and
a workstation having a central controller connected to an output of the second layer of programmable logic devices, the workstation configured to process and reconstruct an image from readout data of the sub-imagers.

16. The semiconductor imager of claim 14, including a second layer of programmable logic devices in communication with the first layer of programmable logic devices, the second layer of programmable logic devices having a quantity of data input/output lines connecting the second layer of programmable logic devices to the first layer of programmable logic devices that is smaller than a quantity of the one or more data input/output lines connecting the first layer of programmable logic devices to the group of respective analog-to-digital converters.

17. The semiconductor imager of claim 16, including
a parallel data bus, and a digital controller connected to the second layer of programmable logic devices, the digital controller configured to execute instruction that cause the digital controller to provide pixel selection control signals; and
a central controller connected to an output of the second layer of programmable logic devices, the workstation configured to process and reconstruct an image from readout data of the sub-imagers.

18. The semiconductor imager of claim 11, including:
a redundant output path connecting a first one of the sub-imager pixel arrays to an adjacent one of the sub-imager pixel arrays; and
a control switch configured to close the redundant output path under control of a digital controller.

19. The semiconductor imager of claim 11, including a respective circuit trace symmetrically located from each four-side buttable imager pixel of the pixel grouping to an input of the buffer amplifier.

20. The semiconductor imager of claim 11, including:
a redundant output path connecting a first one of the sub-imager pixel arrays to an adjacent one of the sub-imager pixel arrays; and
a control switch configured to close the redundant output path under control of a digital controller.

* * * * *